US012763610B2

(12) United States Patent
Rekstad, Jr. et al.

(10) Patent No.: US 12,763,610 B2
(45) Date of Patent: Oct. 13, 2026

(54) SYSTEMS, METHODS, AND APPARATUSES FOR ENERGY DISTRIBUTION MANAGEMENT

(71) Applicant: Comcast Cable Communications, LLC, Philadelphia, PA (US)

(72) Inventors: Gary Michael Rekstad, Jr., Philadelphia, PA (US); Thomas Rushik, Warminister, PA (US); Kenneth Carpenter, Mount Laurel, NJ (US); Sabrina Martin, Croydon, PA (US); Saiprasad Naimpally, Downingtown, PA (US); Mansur Pagdiwala, Newtown, PA (US); Philip Reeves, Philadelphia, PA (US); Scott Ghiz, Doylestown, PA (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 846 days.

(21) Appl. No.: 16/219,407

(22) Filed: Dec. 13, 2018

(65) Prior Publication Data

US 2020/0195056 A1 Jun. 18, 2020

(51) Int. Cl.

| | |
|---|---|
| ***H02J 50/40*** | (2016.01) |
| ***G01R 19/165*** | (2006.01) |
| ***G01R 31/382*** | (2019.01) |
| ***H02J 50/20*** | (2016.01) |
| ***H02J 50/80*** | (2016.01) |

(52) U.S. Cl.

CPC ........ *H02J 50/40* (2016.02); *G01R 19/16542* (2013.01); *G01R 31/382* (2019.01); *H02J 50/20* (2016.02); *H02J 50/80* (2016.02)

(58) Field of Classification Search

CPC .......... H02J 50/001; H02J 50/20; H02J 50/40; H02J 50/80

See application file for complete search history.

(56) References Cited

U.S. PATENT DOCUMENTS

| | | | | |
|---|---|---|---|---|
| 2010/0253281 | A1* | 10/2010 | Li | H04B 5/79 320/108 |
| 2011/0320832 | A1* | 12/2011 | Boss | G06F 1/266 713/300 |
| 2013/0154387 | A1* | 6/2013 | Lee | H02J 50/12 307/104 |
| 2015/0303741 | A1* | 10/2015 | Malik | H02J 50/001 307/104 |
| 2018/0166906 | A1* | 6/2018 | Malhotra | H02J 50/10 |
| 2018/0262039 | A1* | 9/2018 | Koo | H02J 7/80 |
| 2019/0305597 | A1* | 10/2019 | Venkatraman | H02J 7/42 |

* cited by examiner

*Primary Examiner* — Rexford N Barnie
*Assistant Examiner* — Joseph N Inge
(74) *Attorney, Agent, or Firm* — BakerHostetler

(57) ABSTRACT

Systems, methods, and apparatuses are described for managing energy distribution. Data relating to energy usage by one or more energy receiving devices may be collected and used to determine an energy transfer schedule. One or more wireless energy transfer devices may wirelessly transfer energy, based on the energy transfer schedule, to one or more of the energy receiving devices.

20 Claims, 6 Drawing Sheets

SYSTEMS, METHODS, AND APPARATUSES FOR ENERGY DISTRIBUTION MANAGEMENT

BACKGROUND

Devices, such as Internet of Things (IoT) devices, may use energy to perform functions, such as communicate with other devices via a network. Energy harvesting devices capture energy from external sources. The energy captured from the external sources by the energy harvesting devices may be used to provide energy to one or more other devices. However, the energy captured from the energy harvesting devices may be quite low compared to the energy needed to perform certain function. Improvements are needed.

SUMMARY

Systems, methods, and apparatuses are described for managing energy distribution. A control device may receive energy usage data indicating energy usage of a plurality of energy receiving devices. The control device may determine, based on the energy usage data, an energy transfer schedule for the plurality of energy receiving devices. The energy transfer schedule may comprise information associated with energy usage or requirements of one or more devices during a period of time, set time, or over a given schedule. The control device may cause, based on the energy transfer schedule, a first wireless energy transfer from a first wireless energy transfer device to a first energy receiving device of the plurality of energy receiving devices. The control device may cause, based on the energy transfer schedule and the first wireless energy transfer, a second wireless energy transfer from the first wireless energy transfer device to a second energy receiving device of the plurality of energy receiving devices. These and other energy distribution management systems, methods, and apparatuses are described herein.

BRIEF DESCRIPTION OF THE DRAWINGS

The following drawings show generally, by way of example, but not by way of limitation, various examples discussed in the present disclosure. In the drawings.

DETAILED DESCRIPTION

Figure 1:
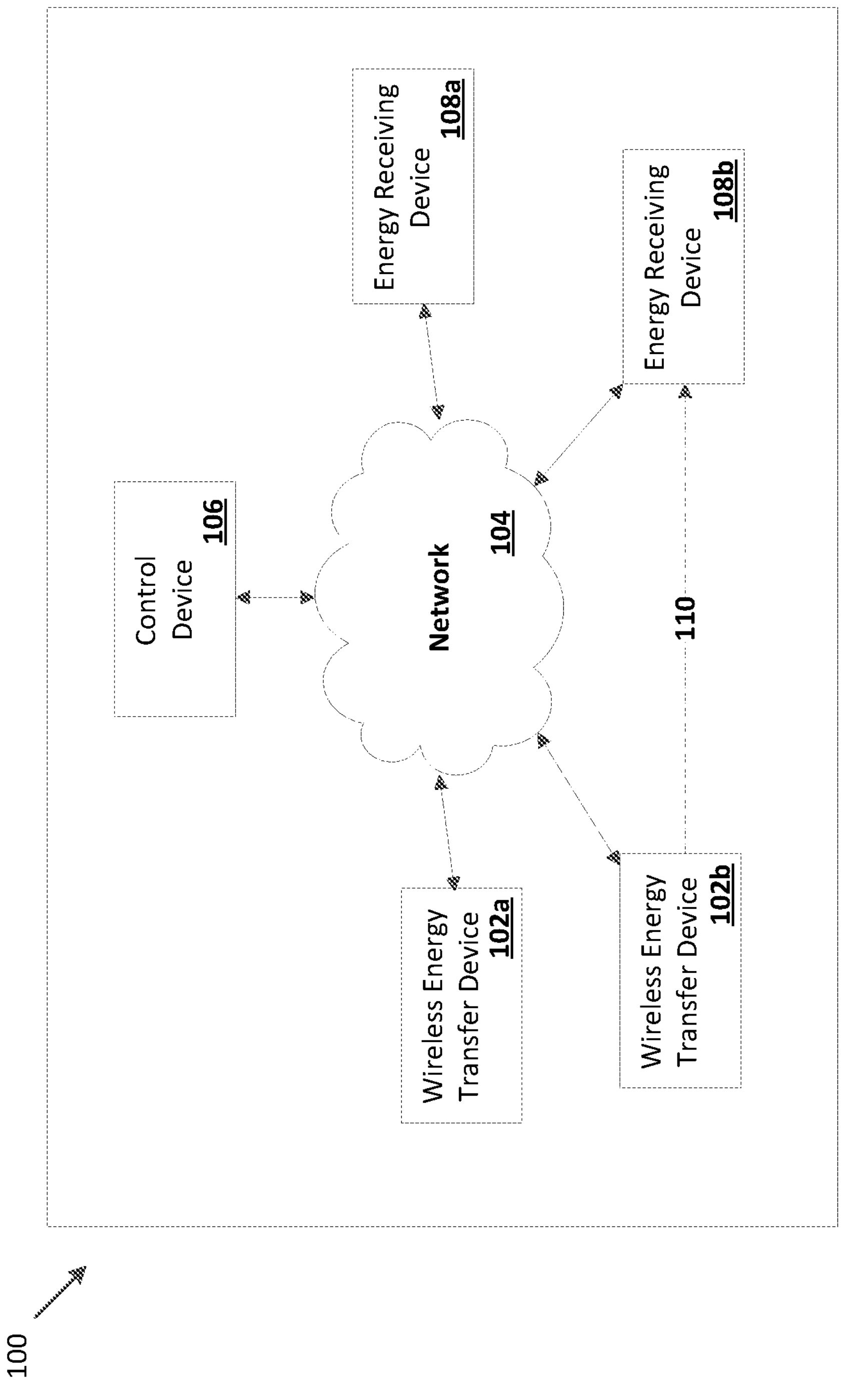
FIG. 1 shows a block diagram of a premises.

Systems, methods, and apparatuses are described for managing energy distribution. One or more wireless energy transfer devices (e.g., energy harvesters, etc.) may collect energy. Wireless energy transfer devices and/or energy receiving devices may selectively transfer energy to be applied as electrical power for one or more operations. It should be understood that the term power may reference the application (e.g., supply, transfer, etc.) of energy, or capability to supply energy, such as electrical energy. A system may comprise an electromagnetic harvester that is capable of gathering electricity from air, a piezoelectric device that generates and stores energy from human actions (such as button presses) or mechanical vibrations (such as vibrations that may occur when a washing machine or other appliance runs), a thermoelectric generator that converts temperature differences into electrical energy, a solar cell that converts light energy into electrical energy, an energy source (such as a household outlet that provides alternating current (AC) or direct current (DC) energy), the like, and/or any combination of the foregoing. The distribution (e.g., sending, transmission, broadcast, etc.) of energy collected via the wireless energy transfer devices may be managed.

The one or more wireless energy transfer devices may communicate with a control device via a network. The one or more wireless energy transfer devices may provide information regarding the collected energy to the control device. Such information may comprise an amount or level of energy available for distribution. Such information may comprise an indication of time associated with the availability of energy for distribution.

One or more energy receiving devices (e.g., IoT devices, remote controls, etc.) may use energy from one or more respective energy sources, such as one or more respective batteries. The one or more energy receiving devices may communicate with other devices such as the control device via the network. The one or more energy receiving devices may provide information regarding energy usage or requirements to the control device. Such information may comprise an amount or level of energy used or requirements for one or more functions or operations of the one or more energy receiving devices. Such information may comprise an indication of time associated with usage or requirements for one or more functions or operations of the one or more energy receiving devices, such as a usage schedule or energy requirements schedule based on a time period.

The control device may comprise or may access an energy transfer schedule. The control device may update the energy transfer schedule based on the provided information from the one or more wireless energy transfer devices and/or the one or more energy receiving devices. The control device may communicate with the one or more wireless energy transfer devices via the network. The control device may cause at least one of the one or more wireless energy transfer devices to transfer some or all of the collected energy to at least one of the one or more energy receiving devices.

An autonomous low-power device (e.g., a battery-enabled device) charging network may be created in a premises. Using one or more energy harvesting devices, an energy repository may be created within a network associated with the premises. The energy repository may be created by using a combination of energy harvesting devices to store energy from the air or from daily/traditional behavior in the premises, such as pressing a button on a remote control or vibrations from an air conditioner, washing machine, or other appliance. The energy repository may also be supplied using traditional premises energy (such as an alternating current (AC) outlet).

Sensors in the premises may be used to monitor battery (or other energy storage device or component) levels of any device such as low-power devices, for example. When battery levels of a low-power device reach a threshold (e.g., <20%, <10%, etc.), the sensor may activate a connection between the low-power device and the energy repository. The threshold may be pre-defined, automatically or manually set based on end-use application, schedule, operational history, or other metrics. The stored energy (e.g., electrical energy) may be wirelessly transferred to a battery of the low-power device. The stored energy may be transferred to a battery of the low-power device via electromagnetic radiation, such as a time-varying electromagnetic field. The electromagnetic radiation may comprise a radio frequency (RF) beam or a laser beam. Types of electromagnetic radiation that may enable wireless energy transfer may comprise microwaves, infrared, (visible) light, ultraviolet, X-rays, and gamma rays. Such electromagnetic radiation used to effect a wireless energy transfer may be considered the medium of the wireless energy transfer.

A focused beam (e.g., a focused RF beam) may be used for short periods of time instead of continuous trickle-charge. Such a focused beam may operate in a far field region of the electromagnetic radiation. In some circumstances, using the focused beam for short periods of time may charge a low-power device more efficiently and avoid blanketing a premises with continuous electromagnetic radiation (e.g., high-energy RF radiation). The low-power devices may comprise less-sensitive energy receivers than energy receivers needed for low-power devices that receive energy from a continuous high-energy RF source. The focused beam may operate as a steady beam.

FIG. 1 shows a block diagram of a premises 100. The premises 100 may comprise one or more wireless energy transfer devices 102*a,b,* a network 104, a control device 106, and one or more energy receiving devices 108*a,b*. The premises 100 may comprise one or more rooms, floors, buildings, etc. The premises 100 may comprise a campus, compound, resort, farm, etc.

The one or more wireless energy transfer devices 102*a,b* may comprise an electromagnetic harvester to capture energy from air. The one or more wireless energy transfer devices 102*a,b* may comprise a piezoelectric device to capture energy from changes in force or pressure (such as a button press or a vibration from a running appliance). The one or more wireless energy transfer devices 102*a,b* may comprise a thermoelectric generator to capture energy from temperature differences. The one or more wireless energy transfer devices 102*a,b* may comprise a solar cell to capture energy from light energy. The one or more wireless energy transfer devices 102*a,b* may comprise an energy source (such as a household outlet that provides alternating current (AC) or direct current (DC) energy). The one or more wireless energy transfer devices 102*a,b* may comprise one or more computing devices 601 described in FIG. 6. The one or more wireless energy transfer devices 102*a,b* may comprise the wireless energy transfer device 102 described in FIG. 3.

The network 104 may facilitate communication between the one or more wireless energy transfer devices 102*a,b,* the control device 106, and the one or more energy receiving devices 108*a,b*. The network 104 may comprise a local area network (LAN) such as a premises network associated with a premises. The control device 106 may be remote from the premises 100. The network 104 may comprise a wide area network (WAN). The network 104 may comprise a private portion, such as the aforementioned LAN or a wireless local area network (WLAN). The network 104 may comprise a public portion, such as the Internet. The network 104 may comprise a physical connection, such as an Ethernet connection. The network 104 may comprise a wireless connection, such as Wi-Fi, Zigbee, or Bluetooth, or a combination thereof. The network 104 may comprise a personal area network (PAN), such as a low-rate wireless personal area network (LR-WPAN). Portions of the network 104, such as an LR-WPAN, may operate according to or based on the IEEE 802.15.4 standard. Types of networks (and components thereof) operating according to or based on the IEEE 802.15.4 standard may comprise Zigbee, ISA 100.11a, WirelessHART, MiWi, SNAP, and 6LoWPAN. The network 104 may comprise a wireless ad hoc network (WANET).

Figure 6:
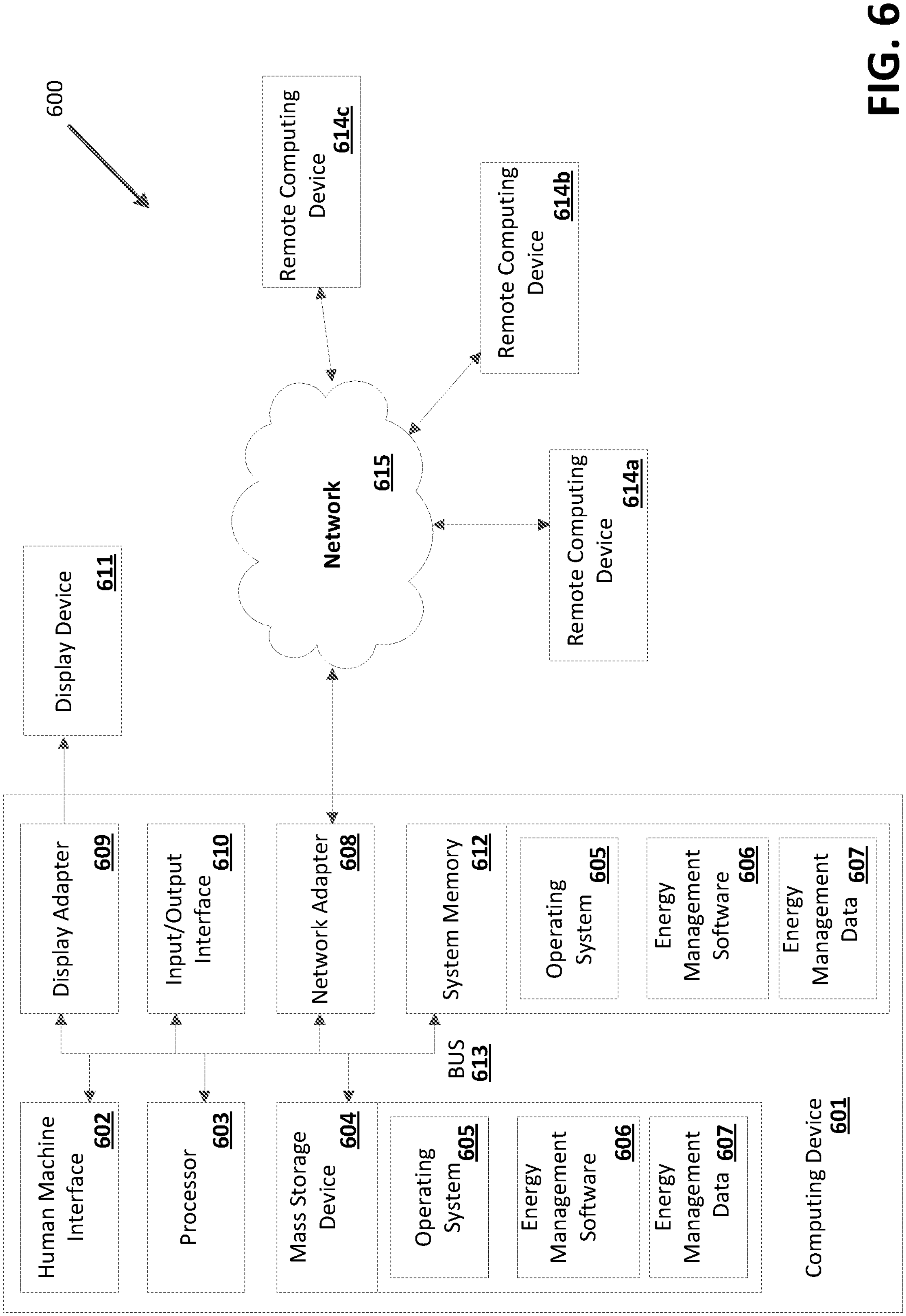
FIG. 6 shows a computing environment.

The control device 106 may comprise one or more computing devices 601 described in FIG. 6. The control device 106 may communicate with the one or more wireless energy transfer devices 102*a,b* via the network 104 using a communication protocol and/or a signaling protocol. The control device 106 may communicate with the one or more energy receiving devices 108*a,b* via the network 104 using a communication protocol and/or a signaling protocol. The control device 106 may provide load balancing by determining which of the one or more wireless energy transfer devices 102*a,b* should provide energy, when the one or more wireless energy transfer devices 102*a,b* should provide energy, to which of the one or more energy receiving devices 108*a,b* the one or more wireless energy transfer devices 102*a,b* should provide the energy, and when the one or more energy receiving devices 108*a,b* should operate to receive the provided energy from the one or more wireless energy transfer devices 102*a,b*. The control device 106 may provide load balancing by determining various attributes according to which the wireless energy transfer should be performed, such as a frequency (e.g., radio frequency) or directionality of the wireless energy transfer. The control device 106 is described in FIG. 2.

The one or more energy receiving devices 108*a,b* may comprise one or more low-power devices, such as one or more battery-enabled devices. The one or more energy receiving devices 108*a,b* may comprise one or more Internet of Things (IoT) devices. The one or more energy receiving devices 108*a,b* may comprise one or more computing devices 601 described in FIG. 6. The one or more energy receiving devices 108*a,b* may comprise the energy receiving device 108 described in FIG. 4.

A wireless energy transfer device 102*b* of the one or more wireless energy transfer devices 102*a,b* may convert environmental energy (e.g., energy derived from heat changes, motion, light and other types of radiation, etc.) and store the converted energy. The converted energy may comprise electrical energy. The wireless energy transfer device 102*b* may communicate information associated with the stored energy to the control device 106 via the network 104.

An energy receiving device 108*b* of the one or more energy receiving devices 108*a,b* may comprise a battery (or other energy storage device or component) level below a threshold, such as twenty percent. The battery level threshold may be pre-determined. Although twenty percent is used as an example, any other battery level may be used. The energy receiving device 108*b* may communicate information associated with the battery level to the control device 106 via the network 104.

The control device 106 may transmit a signal to the wireless energy transfer device 102*b* via the network 104. The signal may comprise instructions to transmit energy to the energy receiving device 108*b*. The instructions may be based on information received from the energy receiving device 108*b* and associated with energy usage of the energy receiving device 108*b* and/or energy reception of the energy receiving device 108*b*. The instructions may be based on information received from the wireless energy transfer device 102*b* and associated with power generation of the wireless energy transfer device 102*b* and/or energy transfer of the wireless energy transfer device 102*b*.

The instructions may indicate for the wireless energy transfer device 102*b* to transmit energy to the energy receiving device 108*b*. In response to the signal, the wireless energy transfer device 102*b* may transmit energy 110 to the energy receiving device 108*b*. The energy 110 may be transmitted using short bursts of a focused radio frequency (RF) beam or other type of beam of electromagnetic radiation. The energy 110 may be transmitted using a steady application of a focused RF beam or other type of beam of electromagnetic radiation. Although not so limited, the focused nature of the beam may facilitate, at least in part, control of the directionality of the beam, including a directionality of the beam that corresponds with the location of the energy receiving device 108*b*. A battery (or other energy storage device or component) of the energy receiving device 108*b* may be charged by the energy 110.

The instructions may indicate one or more attributes according to which the energy 110 is to be transmitted to the energy receiving device 108*b*. The one of more attributes may relate to the wireless energy transfer, such as one or more attributes of a beam of energy. The one or more attributes for the wireless energy transfer may be determined by the control device 106. The one or more attributes for the wireless energy transfer may be based on at least one of the information received from the wireless energy transfer device 102*b* and the information received from the energy receiving device 108*b*.

The instructions may indicate for the beam of energy 110 to be directed to the energy receiving device 108*b*. The one or more attributes for the wireless energy transfer may facilitate wireless energy transfer from the wireless energy transfer device 102*b* to the energy receiving device 108*b*. The one or more attributes for the wireless energy transfer may facilitate energy transfer from the wireless energy transfer device 102*b* to the energy receiving device 108*b* at the exclusion of other proximate energy receiving devices, such as the energy receiving device 108*a*.

The signal from the control device 106 may comprise instructions for the wireless energy transfer device 102*b* to transfer energy to the energy receiving device 108*b* at an indicated frequency (e.g., radio frequency or light frequency) of a medium for wireless energy transfer (e.g., radio waves or light waves). Additionally or alternatively, the wireless energy transfer device 102*b* may be already configured to transmit energy to the energy receiving device 108*b* at the indicated frequency. The wireless energy transfer device 102*b* may be configured to generally transfer energy at the indicated frequency without regard to a target energy receiving device 108*a,b*. The frequency may be based on the energy receiving device 108*b,* such as the antenna (or other form of wireless energy receiver) of the energy receiving device 108*b* and/or the frequency to which the antenna (or other form of wireless energy receiver) of the energy receiving device 108*b* is tuned or is configurable to be tuned. As used herein and unless clearly indicated otherwise by context or express description, the term "frequency" refers to one or both of a specific frequency and a frequency band.

The signal from the control device 106 may comprise instructions for the wireless energy transfer device 102*b* to transmit energy to the energy receiving device 108*b* using an indicated antenna (or other form of wireless energy transmitter) of a plurality of antennas of the wireless energy transfer device 102*b*. The antennas of the plurality of antennas may be each configured to transfer energy using different, at least in part, frequencies. The indicated antenna of the wireless energy transfer device 102*b* may be based on an antenna (or other form of wireless energy receiver) of the energy receiving device 108*b,* such as the frequency to which the antenna of the energy receiving device 108*b* is tuned or is configurable to be tuned. Additionally or alternatively, the instructions may indicate for the wireless energy transfer device 102*b* to transfer energy to the energy receiving device 108*b* while the wireless energy transfer device 102*b* determines which antenna(s) of the wireless energy transfer device's 102*b* plurality of antennas to use in transferring energy to the energy receiving device 108*b*.

The signal from the control device 106 may comprise instructions for the wireless energy transfer device 102*b* to transmit energy in an indicated direction. The indicated direction may be based on the energy receiving device 108*b,* such as the location of the energy receiving device 108*b* and/or the location of the energy receiving device 108*b* relative to the location of the wireless energy transfer device 102*b*. The instructions for the wireless energy transfer device 102*b* to transmit energy in the direction may indicate a directionality (e.g., a three-dimensional directionality) for an antenna of the wireless energy transfer device 102*b* to assume or to be configured. The instructions for the wireless energy transfer device 102*b* to transmit energy may indicate one or more antennas of a plurality of antennas of the wireless energy transfer device 102*b*. At least some antennas of the plurality of antennas may point in different, at least in part, directions. The antenna(s) indicated in the instructions may point in a direction corresponding to the location of the energy receiving device 108*b*. Additionally or alternatively, the wireless energy transfer device 102*b* may determine which antenna(s) of the wireless energy transfer device's 120*b* plurality of antennas to use to effect the directionality indicated in the instructions.

The one or more attributes for the wireless energy transfer indicated in the instructions of the signal from the control device 106 may comprise one or more attributes relating to timing of the wireless energy transfer (e.g., start and end times for the wireless energy transfer, total elapsed time), quantity of energy to transmit (e.g., an aggregate quantity of energy to transmit over a period of time), and rate of energy transfer.

Figure 2:
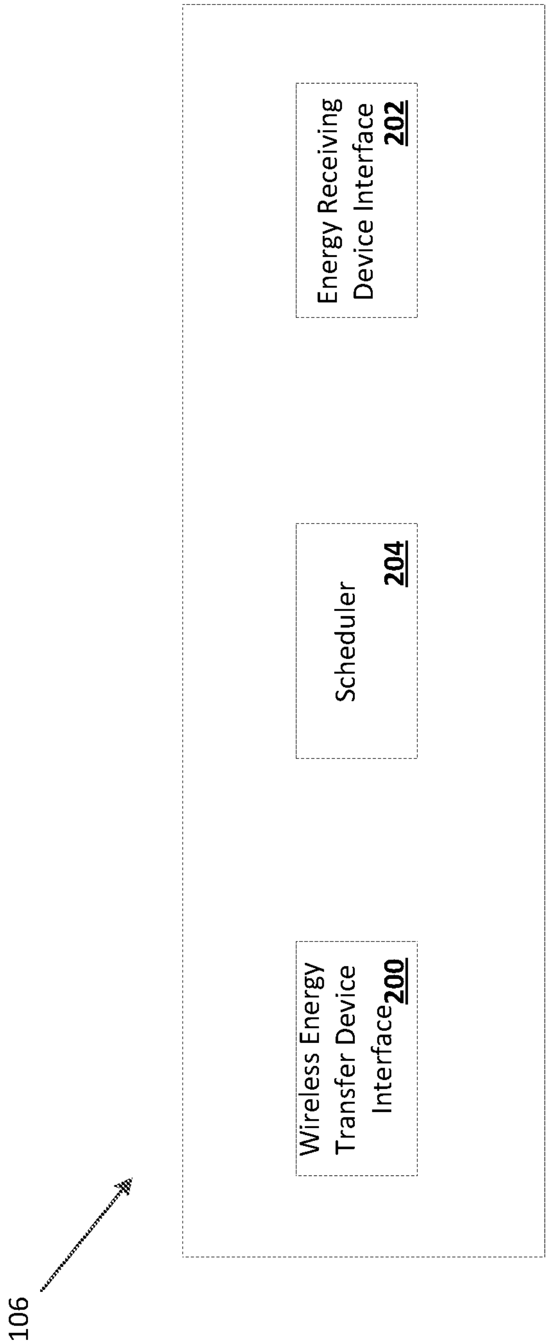
FIG. 2 shows a block diagram of a control device.

FIG. 2 shows a block diagram of the control device 106. The control device 106 comprises a wireless energy transfer device interface 200, an energy receiving device interface 202, and a scheduler 204. A single module may comprise the wireless energy transfer device interface 200, the energy receiving device interface 202, and/or the scheduler 204. Multiple modules may comprise one or more of the wireless energy transfer device interface 200, the energy receiving device interface 202, and the scheduler 204. The wireless energy transfer device interface 200, the energy receiving device interface 202, and/or the scheduler 204 may each represent one or more modules.

The control device 106 may receive communications (e.g., signals, messages, data, etc.) from the one or more wireless energy transfer devices 102*a,b* in FIG. 1 via the wireless energy transfer device interface 200. The wireless energy transfer device interface 200 may comprise and/or be in communication with a port for communicating with the one or more wireless energy transfer devices 102*a,b*. The wireless energy transfer device interface 200 may receive power generation data from the one or more wireless energy transfer devices 102*a,b*. The power generation data may comprise data associated with historical and/or current operations and/or states of the one or more wireless energy transfer devices 102*a,b*. The power generation data may comprise an energy supply level, a power generation rate, an aggregate of energy quantity generated over a period of time, an interval between power generation, falling below an energy supply threshold, a time of power generation (e.g., a discrete time point or an elapsed time, continuous or discontinuous), a start time of power generation and a corresponding end time of power generation, the like, and/or any combination of the foregoing. The power generation data may comprise data relating to energy transfers performed or being performed by the one or more wireless energy transfer devices 102*a,b,* such as a time of energy transfer (e.g., a discrete time point or an elapsed time, continuous or discontinuous), an aggregate of energy quantity transferred over a period of time, an interval between energy transfers, exceeding an energy transfer threshold, a start time of energy transfer and a corresponding end time of energy transfer, the like, or any combination thereof. The wireless energy transfer device interface 200 may facilitate the power generation data being interpretable by the scheduler 204.

The control device 106 may receive communications (e.g., signals, messages, data, etc.) from the one or more energy receiving devices 108*a,b* in FIG. 1 via the energy receiving device interface 202. The energy receiving device interface 202 may comprise and/or be in communication with a port for communicating with the one or more energy receiving devices 108*a,b.* The energy receiving device interface 202 may receive energy usage data from the one or more energy receiving devices 108*a,b.* The energy usage data may comprise data associated with historical and/or current operations and/or states of the one or more energy receiving devices 108*a,b.* The control device 106 may receive the energy usage data via the one or more wireless energy transfer devices 102*a,b.* The control device 106 may receive the energy usage data via the wireless energy transfer device interface 200 instead of the energy receiving device interface 202. The one or more wireless energy transfer devices 102*a,b,* may have received the energy usage data from the one or more energy receiving devices 108*a,b* in a previous wireless energy transfer between the two.

The energy usage data may comprise a battery (or other energy storage device or component) energy level, an energy usage rate, an interval between energy usage, exceeding an energy level threshold, falling below an energy level threshold, a time of energy usage, a start time of energy usage and a corresponding end time of energy usage, the like, and/or any combination of the foregoing. The energy usage data may comprise data relating to the one or more energy receiving devices 108*a,b* receiving wireless energy transfer (s), such as a time of receiving energy (e.g., an elapsed time, continuous or discontinuous), an aggregate quantity of energy received over a period of time, a start time of receiving energy and a corresponding end time of receiving energy, falling below an energy reception minimum threshold, the like, and/or any combination of the foregoing. The energy receiving device interface 202 may facilitate the energy usage data being interpretable by the scheduler 204.

The scheduler 204 may create a power generation schedule for one or more of the one or more wireless energy transfer devices 102*a,b* based on one or more of the power generation data and the energy usage data. The power generation schedule for a wireless energy transfer device may indicate one or more of a time (e.g., an elapsed time, continuous or discontinuous) for power generation, a rate of power generation, a start time and a corresponding end time for power generation, and a minimum aggregate quantity of power generation over a period of time. A power generation schedule may be specific to a particular wireless energy transfer device 102*a,b* or a power generation schedule may comprise power generation schedule data associated with multiple wireless energy transfer devices 102*a,b.*

The scheduler 204 may create an energy transfer schedule for one or more of the one or more energy receiving devices 108*a,b* based on one or more of the power generation data and the energy usage data. The energy transfer schedule for an energy receiving device may comprise one or more of an indication that the energy receiving device is the recipient of the wireless energy transfer, an indication that the wireless energy transfer device 102 is to perform the wireless energy transfer, a time for wireless energy transfer to the energy receiving device; a quantity of energy for wireless energy transfer to the energy receiving device; a start time and a corresponding end time for wireless energy transfer to the energy receiving device; one or more of the one or more wireless energy transfer device 102*a,b* to wirelessly transfer energy to the energy receiving device; a ratio, for a period of time, between 1) a quantity of energy for wireless energy transfer to the energy receiving device, and 2) a quantity of energy for wireless energy transfer to a second energy receiving device; a ratio, for a period of time, between 1) an elapsed time (continuous or discontinuous) of wireless energy transfer to the energy receiving device, and 2) an elapsed time (continuous or discontinuous) of wireless energy transfer to a second energy receiving device; a maximum time interval between wireless energy transfers to the energy receiving device; a minimum time interval between wireless energy transfers to the energy receiving device; a minimum aggregate quantity of energy wirelessly transferred to the energy receiving device over a period of time; a frequency (e.g., a radio frequency or light frequency) of a medium (e.g., radio waves or light waves) for the wireless energy transfer; a directionality of the wireless energy transfer; a location of the energy receiving device (e.g., a location relative to the one or more wireless energy transfer devices 102*a,b*); an antenna of a plurality of antennas of the one or more wireless energy transfer devices 102*a,b* for use in performing the wireless energy transfer, such as an antenna that corresponds to the aforementioned frequency for the wireless energy transfer and/or an antenna with a directionality corresponding to the target energy receiving device. An energy transfer schedule may be specific to a particular wireless energy transfer device 102*a,b* or an energy transfer schedule may comprise energy transfer schedule data associated with multiple wireless energy transfer devices 102*a,b.*

The scheduler 204 may provide load balancing by determining when the one or more wireless energy transfer devices 102*a,b* should provide energy, and to which of the one or more energy receiving devices 108*a,b* the one or more wireless energy transfer devices 102*a,b* should provide the energy. The scheduler 204 may use one or more power generation schedules and/or one or more energy transfer schedules to determine that one of the one or more energy receiving devices 108*a,b* needs energy. The scheduler 204 may use one or more power generation schedules and/or one or more energy transfer schedules to determine that one of the one or more wireless energy transfer devices 102*a,b* should provide energy to the one of the one or more energy receiving device 108*a,b* that needs energy. The scheduler 204 may cause the wireless energy transfer device interface 200 to transmit a signal to the one of the one or more wireless energy transfer devices 102*a,b* that should provide energy. The signal may cause the one of the one or more wireless energy transfer devices 102*a,b* that should provide energy to provide energy to the one of the one or more energy receiving device 108*a,b* that needs energy.

Figure 3:
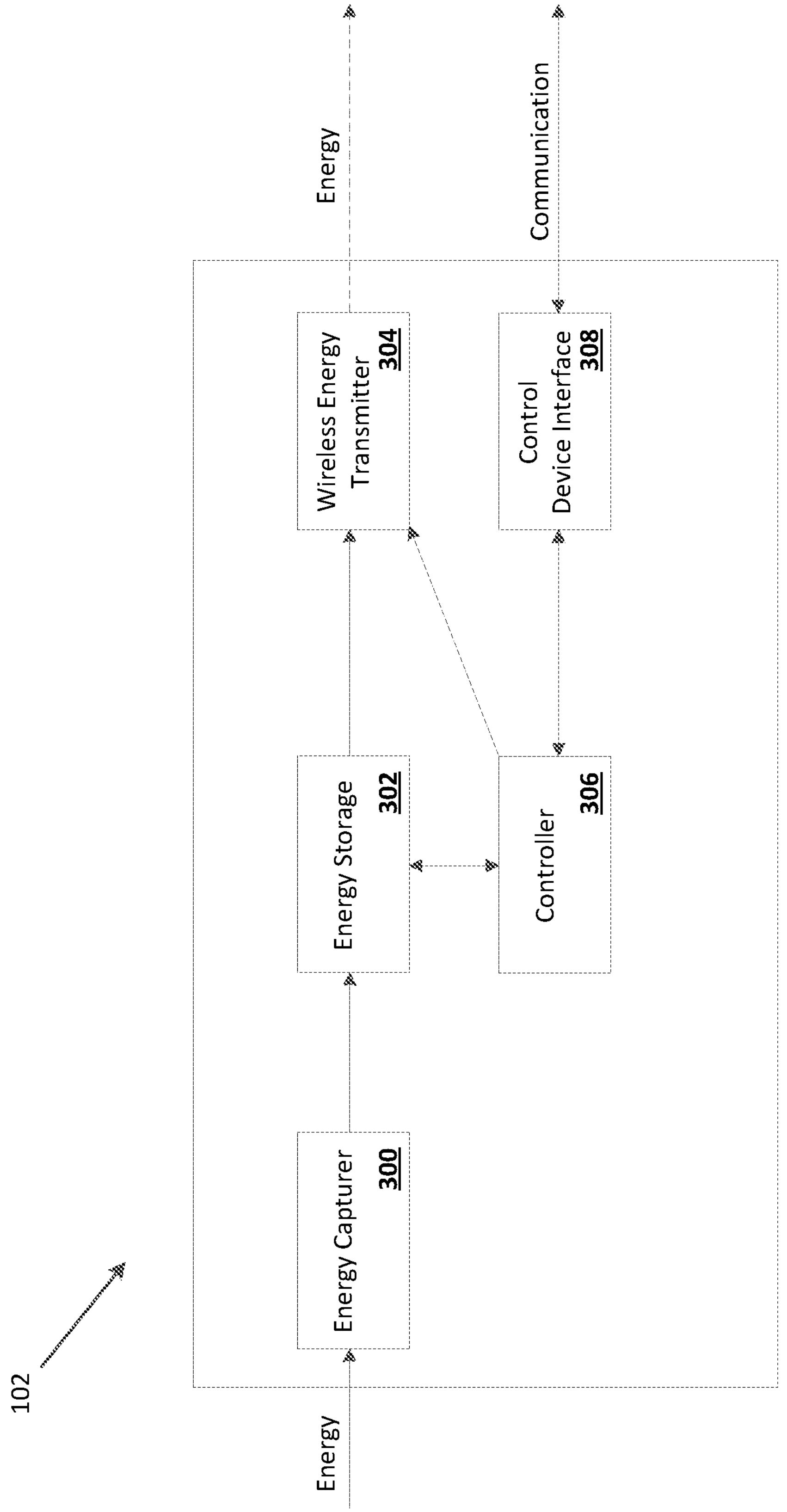
FIG. 3 shows a block diagram of a wireless energy transfer device.

FIG. 3 shows a block diagram of a wireless energy transfer device 102, such as one of the one or more wireless energy transfer devices 102*a,b* in FIG. 1. The wireless energy transfer device 102 may comprise an energy capturer 300, energy storage 302, a wireless energy transmitter 304, a controller 306, and a control device interface 308. The wireless energy transfer device 102 may comprise an energy harvester, an electromagnetic device, a piezoelectric device, a thermoelectric device, a solar device, an energy source, the like, and/or any combination of the foregoing.

The energy capturer 300 may convert external elements and/or changes in external elements into energy. The energy capturer 300 may convert air, pressure, force, heat, light, acoustics, changes in any of the foregoing, energy from an energy source, the like, and/or any combination of the foregoing into energy. The converted energy may comprise electrical energy. The energy capturer 300 may provide the converted energy to the energy storage 302.

The energy storage 302 may store the energy converted by the energy capturer 300. The energy storage 302 may comprise a battery. The energy storage 302 may comprise an accumulator. The energy storage 302 may comprise other types of energy storage and is not limited to a battery or accumulator. The energy storage 302 may provide energy to the wireless energy transmitter 304. Energy may be released from the energy storage 302 to the wireless energy transmitter 304 in accordance with instructions from the controller 306. The energy storage 302 may provide information regarding energy stored to the controller 306.

The wireless energy transmitter 304 may receive energy from the energy storage 302. The wireless energy transmitter 304 may transmit energy to one of the one or more energy receiving devices 108*a,b* specified by the controller 306. The wireless energy transmitter 304 may comprise a radio frequency (RF) transmitter (e.g., a radio antenna), a laser source, or other source of electromagnetic radiation. The wireless energy transmitter 304 may transmit the energy in a focused beam. The wireless energy transmitter 304 may transmit the energy in short bursts. The wireless energy transmitter 304 may transmit the energy as a steady beam. The wireless energy transmitter 304 may transmit the energy in the far-field region(s) of the wireless energy transmitter 304. The wireless energy transmitter 304 may comprise a laser source configured to generate a laser to transmit energy.

The wireless energy transmitter 304 may be positioned in the wireless energy transfer device 102 (or otherwise configured) to effect a directionality of the wireless energy transmitter 304. The wireless energy transmitter 304 may be configured to have a fixed directionality relative to the wireless energy transfer device 102. The wireless energy transmitter 304 may be configured to adjust, at least in part, the directionality of the wireless energy transmitter 304. The directionality of the wireless energy transmitter 304 may be adjusted based on a signal from the control device 106 and/or the controller 306 of the wireless energy transfer device 102. The directionality of the wireless energy transmitter 304 may be adjusted so that the wireless energy transmitter 304 transmits energy to the energy receiving device 108. The directionality of the wireless energy transmitter 304 may correspond with the direction of the energy receiving device 108 along a direct path. Additionally or alternatively, the directionality of the wireless energy transmitter 304 may correspond with an indirect path to the energy receiving device 108, such as if the beam of energy is reflected off of one or more surfaces before arriving at the energy receiving device 108.

The wireless energy transmitter 304 may be configured to transmit energy at an indicated frequency (e.g., a radio frequency or a light frequency). The wireless energy transmitter 304 may be configured to adjust the frequency at which the wireless energy transmitter 304 transmits energy. The frequency may be adjusted based on a frequency indicated in a signal from the control device 106 and/or the controller 306. The indicated frequency may correspond to a frequency to which an intended energy receiving device 108 is tuned. The target energy receiving device 108 may comprise an antenna (or other form of wireless energy receiver) turned to the indicated frequency.

The wireless energy transfer device 102 may comprise a plurality of wireless energy transmitters 304. One or more of the plurality of wireless energy transmitters 304 may be selectively activated based on a signal instructing the same from the control device 106 and/or the controller 306. Two or more of the plurality of wireless energy transmitters 304 may be configured and/or positioned to transmit energy in different directions from one another. A selective activation of a wireless energy transmitter 304 of the two or more wireless energy transmitters 304 may cause the wireless energy transfer device 102 to transfer energy in the direction corresponding to that of the selectively-activated wireless energy transmitter 304.

Two or more wireless energy transmitters 304 of the plurality of wireless energy transmitters 304 may be configured to transmit energy at different frequencies of electromagnetic radiation from one another. A signal from the control device 106 and/or the controller 306 may indicate a wireless energy transmitter 304 of the two or more wireless energy transmitters 304 for the wireless energy transfer device 102 to use in transmitting energy. The indicated wireless energy transmitter 304 may perform the energy transmission. A signal received by the wireless energy transfer device 102 may indicate a determined frequency (e.g., the frequency to which a target energy receiving device is tuned). Based on the frequency indicated by the signal, the wireless energy transfer device 102 and/or the controller 306 may determine a wireless energy transmitter 304 of the two or more wireless energy transmitters 304 that is configured to transmit energy at the indicated frequency. The wireless energy transfer device 102 may use the determined wireless energy transmitter 304 to transmit energy at the indicated frequency to the energy receiving device 108.

The controller 306 may cause energy to be released from the energy storage 302. The controller 306 may cause the wireless energy transmitter 304 to transmit the released energy to one of the one or more energy receiving devices 108*a,b*. The controller 306 may receive information from the control device interface 308. The information received from the control device interface 308 may form a basis, at least in part, for when the wireless energy transmitter 304 transmits energy, where the energy is transmitted, and other attributes of the wireless energy transfer. The controller 306 may receive power generation data and/or power generation data from the energy storage 302. The controller 306 may create the power generation data and/or power generation data by observing the energy storage 302. The controller 306 may create the power generation data and/or power generation data by interpreting a sensor associated with the energy storage 302. The controller 306 may provide the power generation data and/or power generation data to the control device interface 308.

The control device interface 308 may comprise and/or be in communication with a port for communicating with the control device 106 in FIG. 1. The control device interface 308 may receive the power generation data and/or power generation data from the controller 306. The power generation data and/or power generation data may comprise an energy supply level, a power generation rate, an aggregate of energy quantity generated over a period of time, an interval between power generation, exceeding an energy transfer threshold, falling below an energy supply threshold, a time of power generation (e.g., a discrete time point or an elapsed time, continuous or discontinuous), a start time of power generation and a corresponding end time of power generation, the like, and/or any combination of the foregoing. The power generation data and/or power generation data may comprise data relating to energy transfers performed by the wireless energy transfer device 102, such as a time of energy transfer (e.g., a discrete time point or an elapsed time, continuous or discontinuous), an aggregate of energy quantity transferred over a period of time, an interval between energy transfers, exceeding an energy transfer threshold, a start time of energy transfer and a corresponding end time of energy transfer, the like, or any combination thereof. The control device interface 308 may provide the power generation data and/or power generation data to the control device 106.

The control device interface 308 may receive information associated with a power generation schedule associated with the wireless energy transfer device 102 from the control device 106. The power generation schedule may comprise a time (e.g., a continuous or a discontinuous elapsed time) for power generation, a rate of power generation, a start time and a corresponding end time for power generation, one or more of the one or more energy receiving devices 108*a,b* to wirelessly transfer energy, a maximum time interval between wireless energy transfers to an energy receiving device of the one or more energy receiving devices 108*a,b,* a minimum time interval between wireless energy transfers to an energy receiving device of the one or more energy receiving devices 108*a,b,* and a minimum aggregate quantity of power generation over a period of time. The control device interface 308 may provide the information associated with the power generation schedule to the controller 306. The controller 306 may cause the energy capturer 300 and the energy storage 302 to capture and store energy based on the power generation schedule. The controller 306 may cause energy from the energy storage 302 to be transmitted to an energy receiving device of the one or more energy receiving devices 108*a,b* based on the power generation schedule.

Figure 4:
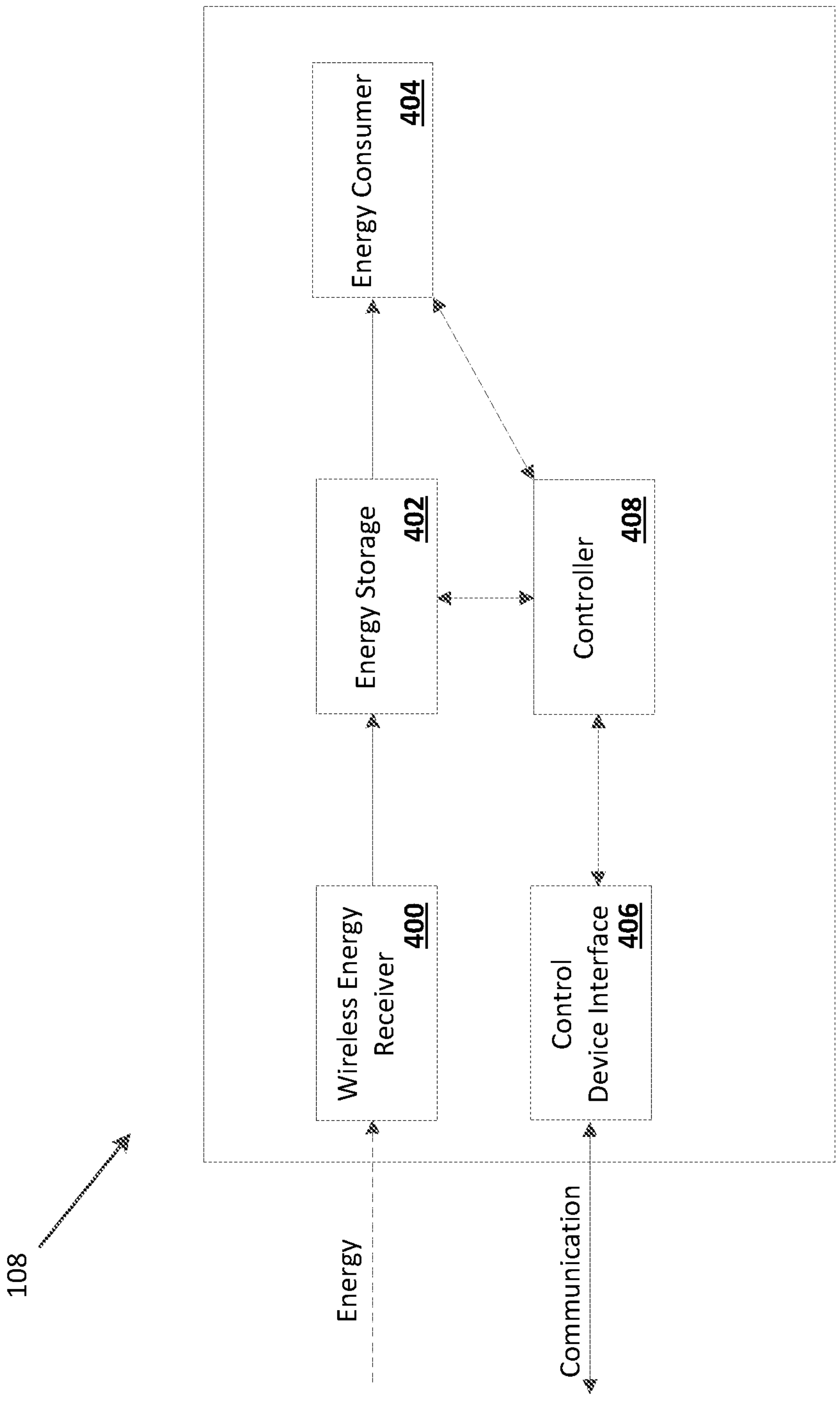
FIG. 4 shows a block diagram of an energy receiving device.

FIG. 4 shows a block diagram of an energy receiving device 108, such as one of the one or more energy receiving devices 108*a,b* in FIG. 1. The energy receiving device 108 may comprise a wireless energy receiver 400, energy storage 402, an energy consumer 404, a control device interface 406, and a controller 408. The energy receiving device 108 may comprise a low-power device, such as an Internet of Things (IoT) device, a remote control, or other type of battery-enabled device.

The wireless energy receiver 400 may receive energy from one or more of the one or more wireless energy transfer devices 102*a,b* in FIG. 1. The wireless energy receiver 400 may transmit energy to the energy storage 402. The wireless energy receiver 400 may comprise a radio frequency (RF) receiver, such as a radio antenna. The wireless energy receiver 400 may comprise a photovoltaic cell. The wireless energy receiver 400 may receive energy transmitted in a focused beam. The wireless energy receiver 400 may receive energy transmitted in short bursts or in a steady beam. The wireless energy receiver 400 may receive particular beams, such as beams comprising one or more attributes, such as beams with a particular frequency or a particular range of frequencies. The wireless energy receiver 400 may be set to a fixed frequency or range of frequencies or may be configured to vary the frequencies at which wireless energy receiver 400 may receive a beam. The wireless energy receiver 400 may be configured at a frequency based on the frequency of an incoming beam indicated in an energy transfer schedule.

The one or more attributes of the beams may comprise a directionality of the beam, such as the directionality corresponding to the path (direct or indirect) of the beam from the one or more wireless energy transfer devices 102*a,b* to the wireless energy receiver 400. The wireless energy receiver 400 may be configured to adjust for varying directionalities of beams. The wireless energy receiver 400 may comprise an antenna or photovoltaic cell with adjustable positioning. The wireless energy receiver 400 may be configured at a positioning based on the directionality of an incoming beam indicated in an energy transfer schedule.

The energy storage 402 may store the energy received via the wireless energy receiver 400. The energy storage 402 may comprise a battery or other energy storage device or component. The energy storage 402 may comprise an accumulator. The energy storage 402 may provide energy to the energy consumer 404. Energy may be released from the energy storage 402 to the energy consumer 404 in accordance with instructions from the controller 408. The energy storage 402 may provide information regarding energy stored to the controller 408.

The energy consumer 404 may comprise a device and/or component that uses energy. For an IoT device, the energy consumer 404 may comprise one or more components used to generate or record data, track data, create a signal regarding data, transmit the created signal via an IoT network, receive a signal via the IoT network, interpret the received signal, etc. For a remote control, the energy consumer 404 may comprise one or more components to create a signal comprising instructions for an electronic device, transfer the created signal to the electronic device, etc. The energy consumer 404 may comprise a mechanical device, such as an engine. The energy consumer 404 may comprise any components of the energy receiving device 108 that use energy. The energy consumer 404 may provide energy use and/or energy use information to the controller 408. The energy consumer 404 may receive instructions, such as instructions to enter a low energy mode, from the controller 408.

The control device interface 406 may comprise and/or be in communication with a port for communicating with the control device 106 in FIG. 1. The control device interface 406 may receive energy usage data and/or energy usage data from the controller 408. The energy usage data and/or energy usage data may comprise a battery (or other energy storage device or component) energy level, an energy usage rate, an interval between energy usage, exceeding an energy level threshold, falling below an energy level threshold, a time (e.g., a continuous or a discontinuous elapsed time) of energy usage, and a start time of energy usage and a corresponding end time of energy usage. The energy usage data and/or energy usage data may comprise data relating to the energy receiving device receiving wireless energy transfer(s), such as a time of receiving energy (e.g., a discrete time point or an elapsed time, continuous or discontinuous), an aggregate quantity of energy received over a period of time, a start time of receiving energy and a corresponding end time of receiving energy, falling below an energy reception minimum threshold, the like, and/or any combination of the foregoing. The control device interface 406 may provide the energy usage data and/or energy usage data to the control device 106.

The control device interface 406 may receive information associated with an energy transfer schedule associated with the energy receiving device 108 from the control device 106. The energy transfer schedule may comprise an indication that the energy receiving device 108 is the target of the wireless energy transfer, an indication that the wireless energy transfer device 102 is to perform the wireless energy transfer, a time for wireless energy transfer to the energy receiving device 108; a quantity of energy for wireless energy transfer to the energy receiving device 108; a start time and a corresponding end time for wireless energy transfer to the energy receiving device 108; one or more of the one or more wireless energy transfer device 102*a,b* to wirelessly transfer energy to the energy receiving device 108; a ratio, for a period of time, between 1) a quantity of energy for wireless energy transfer to the energy receiving device 108, and 2) a quantity of energy for wireless energy transfer to a second energy receiving device; a ratio, for a period of time, between 1) an elapsed time of wireless energy transfer to the energy receiving device 108, and 2) an elapsed time of wireless energy transfer to a second energy receiving device; a maximum time interval between wireless energy transfers to the energy receiving device 108; a minimum time interval between wireless energy transfers to the energy receiving device 108; and a minimum aggregate quantity of energy wirelessly transferred to the energy receiving device 108 over a period of time; a frequency (e.g., a radio frequency or light frequency) of a medium (e.g., radio waves or light waves) for the wireless energy transfer; a directionality of the wireless energy transfer; a location of the energy receiving device 108 (e.g., a location relative to the one or more wireless energy transfer devices 102); an antenna of a plurality of antennas of the one or more wireless energy transfer devices 102 for use in performing the wireless energy transfer, such as an antenna that corresponds to the aforementioned frequency for the wireless energy transfer and/or an antenna with a directionality corresponding to the energy receiving device 108. The control device interface 406 may provide the information associated with the energy transfer schedule to the controller 408.

The controller 408 may cause energy to be released from the energy storage 402. The controller 408 may control the energy consumer 404, such as causing the energy consumer 404 to operate in a low-energy (e.g., low-battery, low-energy, etc.) mode. The controller 408 may receive information, such as the energy transfer schedule, from the control device interface 406. The information received from the control device interface 406 may influence when and/or how energy is released from the energy storage 402 and/or how the energy consumer 404 is controlled. The information (e.g., the energy transfer schedule) received from the control device interface 406 may be used by the controller 408 to determine one or more frequencies at which the energy receiving device 108 is configured to receive wireless energy transfers. The one or more frequencies may be determined based on the energy transfer schedule and may correspond with the one or more frequencies that are likewise determined, based on the energy transfer schedule, by one or more of the wireless energy transfer devices 102*a,b* to implement the wireless energy transfer from the one or more wireless energy transfer devices 102*a,b* to the energy receiving device 108. As such, the frequencies used by one or more wireless energy transfer devices 102*a,b* to generate the beam for the wireless energy transfer and the frequencies used by one or more energy receiving devices 108*a,b* may be coordinated to control which energy receiving devices 108*a,b* receive a given wireless energy transfer and which do not. Such coordination may be based on the energy transfer schedule.

The controller 408 may receive energy usage data and/or energy usage data from the energy storage 402. The controller 408 may create the energy usage data and/or energy usage data by observing the energy storage 402. The controller 408 may create the energy usage data and/or energy usage data by interpreting a sensor associated with the energy storage 402. The controller 408 may provide the energy usage data and/or energy usage data to the control device interface 406.

The one or more energy receiving devices 108*a,b* in FIG. 1 may comprise a motion sensor to monitor the premises and an automated thermostat for controlling the temperature inside the premises. The motion sensor is configured with an antenna tuned to receive a wireless energy transfer at a first frequency. The thermostat is configured with an antenna tuned to receive a wireless energy transfer at a second frequency, different from the first frequency. The one or more wireless energy transfer devices 102*a,b* may comprise a solar panel on the roof of the premises and a motion-energy harvester incorporated within a refrigerator at the premises.

At a first time at 12:00 PM on a first day, first energy usage data indicates that the motion sensor's battery (or other energy storage device or component) has low energy and the motion sensor operates (i.e., consumes energy) between the hours of 8:00 PM and 7:00 AM (i.e., primarily at night). The first energy usage data indicates that the thermostat's battery has a high capacity and is at a high energy level and the thermostat consumes energy at a low, but consistent rate throughout a 24-hour day. Also at the first time, first power generation data indicates that the solar panel's current power generation rate is low (due to overcast weather) and the solar panel's battery is at a low energy level. The first power generation data indicates that the motion-energy harvester's current power generation rate is high and the motion-energy harvester's battery is near capacity.

Based on the first energy usage data and/or the first power generation data, the control device 106 in FIG. 1 may determine a first energy transfer schedule. Based on the first energy transfer schedule, the control device 106 may determine instructions indicating that the motion-energy harvester is to perform a wireless energy transfer to the motion sensor commencing immediately (12:00 PM), the frequency of the beam (the motion sensor's antenna's first frequency), and an aggregate quantity of energy to transfer to the motion sensor (which corresponds to the motion sensor's battery's capacity). The motion-energy harvester may receive the instructions and perform the wireless energy transfer to the motion sensor accordingly. The control device 106 may determine, based on the first energy transfer schedule, instructions indicating that the solar panel is not to perform a wireless energy transfer (e.g., during the subsequent four hours). The solar panel may receive the instructions and operate accordingly.

By instructing the motion-energy harvester to perform the wireless energy transfer at the first frequency, the wireless energy transfer will be received by the motion sensor but not the thermostat (which operates on the second frequency). The frequency of the wireless energy transfer may be used to control which energy receiving devices receive a wireless energy transfer and which do not. Further, the instructions to the motion-energy harvester may be based on the times or schedule that the motion sensors consumes energy, such as providing the motion sensor with necessary energy to begin operation at 8:00 PM that evening. The instructions for the motion-energy harvester to transfer the indicated aggregate quantity of energy may be determined based on the motion sensor's battery's storage capacity, thus avoiding wasteful transfers of energy that cannot be stored by the motion sensor. The instructions for the motion-energy harvester may be determined based on the solar panel's low power generation rate and the solar panel's inability to generate energy during the night (i.e., the solar panel's power generation schedule, generally)—the motion sensor may be left without energy if the solar panel was instead relied upon. The instructions for the motion-energy harvester may be determined based on the near-capacity state of the motion-energy harvester's battery, which indicates that the motion-energy harvester has available energy to transfer and further power generation by the motion-energy harvester may be fruitless or cause unnecessary wear or damage to the motion-energy harvester. The instructions for the solar panel to not perform a wireless energy transfer may be determined based on the solar panel's low power generation rate, the solar panel's battery's low energy level, and the time of day.

Based on the first energy usage data and the first power generation data, the control device 106 may determine a first power generation schedule. Based on the first power generation schedule, the control device 106 may determine instructions indicating that the motion-energy harvester is to reduce its power generation rate and generate a maximum aggregate quantity of energy (corresponding to that which will be transferred to the motion sensor) over a period of time. The instructions for the motion-energy harvester to reduce the power generation rate may be determined based on the motion-energy harvester's battery being near capacity, thus avoiding unnecessary or damaging over-generation of energy. The instructions for the motion-energy harvester to transmit the indicated aggregate quantity of energy may be based on the quantity of energy that the motion-energy harvester is to wirelessly transfer to the motion sensor. The control device 106 may determine, based on the first power generation schedule, instructions indicating that the solar panel is to generate energy at a maximum rate. The instructions to the solar panel may be based on the solar panel's low power generation rate, the solar panel's battery's low energy level, and the time of day.

At a second time at 8:00 AM on a second day, second energy usage data indicates that the motion sensor's battery has moderate energy and the motion sensor operates (i.e., consumes energy) between the hours of 8:00 PM and 7:00 AM (i.e., primarily at night). The second energy usage data indicates that the thermostat's battery is at a low energy level. Also at the second time, second power generation data indicates that the solar panel's current power generation rate is low and the solar panel's battery is at a low energy level. The second power generation data indicates that the motion-energy harvester's current power generation rate is high and the motion-energy harvester's battery is at a moderate energy level.

Based on the second energy usage data and/or the second power generation data, the control device 106 may determine a second energy transfer schedule. Based on the second energy transfer schedule, the control device 106 may determine instructions indicating that the motion-energy harvester is to perform a wireless energy transfer to the thermostat commencing immediately (8:00 AM) and at the second frequency (the tuned frequency of the thermostat). The motion-energy harvester may receive the instructions and perform the wireless energy transfer to the thermostat accordingly. The control device 106 may determine, based on the second energy transfer schedule, instructions indicating that the solar panel is to perform a wireless energy transfer to the motion sensor and at the first frequency (the tuned frequency of the motion sensor). The solar panel may receive the instructions and perform the wireless energy transfer to the motion sensor accordingly.

The instructions for the motion-energy harvester to wirelessly transfer energy to the thermostat may be determined based on the thermostat's battery's low energy level and the thermostat's 24-hour operation, such that the thermostat does not run out of energy during its intended period of operation. The instructions for the motion-energy harvester may be determined based on the motion-energy harvester's high rate of power generation and its battery's moderate energy level, which indicate that the motion-energy harvester has energy available to be wirelessly transferred to the thermostat. The instructions for the motion-energy harvester may be determined based on the current time and the motion sensor's times of energy consumption (during the night)—while the motion sensor's battery is low, ample time remains for the motion sensor's battery to be charged. The instructions for the motion-energy harvester may be determined based on the solar panel's low power generation rate and the solar panel's battery's low energy level—energy wirelessly transferred from the solar panel instead of the motion-energy harvester may be insufficient for the thermostat to maintain operation. The instructions for the solar panel to perform a wireless energy transfer to the motion sensor may be determined based on the current time and the times that the motion sensor consumes energy, such that the motion sensor may store any energy that the solar panel is able to generate and transfer throughout the day but does not actually require energy until 8:00 PM. Based on energy usage and generation data from later in the day, wireless energy transfer, such as from the motion-energy harvester, may be redirected to the motion sensor if needed.

Based on the second energy usage data and the second power generation data, the control device 106 may determine a second power generation schedule. Based on the second power generation schedule, the control device 106 may determine instructions indicating that the motion-energy harvester is to generate energy at a maximum rate. The instructions for the motion-energy harvester to generate energy at the maximum rate may be determined based on the low energy level of the thermostat's battery and the 24-hour operation of the thermostat (as well as the concurrent instructions for the motion-energy harvester to transfer energy to the thermostat), which indicate that the motion-energy harvester may require energy to recoup for the energy transferred to the thermostat. The instructions for the motion-energy harvester may be determined based on the motion-energy harvester's battery's moderate energy level, indicating that the battery has additional capacity for energy storage without risking wasted power generation and/or unnecessary wear or damage to the motion-energy harvester due to over-generation of energy. The control device 106 may determine, based on the second power generation schedule, instructions indicating that the solar panel is to generate energy at a maximum rate. The instructions to the solar panel may be based on the solar panel's low power generation rate, the solar panel's battery's low energy level, and the time of day. The instructions to the solar panel may be based on the moderate energy level of the motion sensor's battery (as well as the concurrent instructions for the solar panel to transfer energy to the motion sensor), which indicate that the solar panel should generate as much energy as possible to recoup any energy transferred to the motion sensor.

The one or more energy receiving devices 108*a,b* in FIG. 1 may comprise a automated light controller to control various lights at the premises. The light controller comprises a configurable antenna that may be selectively adjusted to set the frequency or frequencies at which the light controller may receive a wireless energy transfer. The configurable antenna may be self-adjustable or may be adjustable by the light controller. The one or more wireless energy transfer devices 102*a,b* may comprise a thermal-energy harvester.

At the first time at 12:00 PM on the first day, the first energy usage data further indicates that the light controller's battery's energy level is low. The first power generation data further indicates that the thermal-energy harvester's power generation rate is moderate and the thermal-energy harvester's battery's energy level is moderate. Based on the first energy usage data and/or the first power generation data, the control device 106 may determine that the thermal-energy harvester is to perform a wireless energy transfer to the light controller. The control device 106 may determine the frequency of the medium of the wireless energy transfer. The control device 106 may determine a third frequency, different from the aforementioned first frequency of the motion sensor and the second frequency of the thermostat. The control device 106 may determine the different third frequency so that interference at the first and second frequencies is avoided and to ensure that the wireless energy transfer from the thermal-energy harvester is not incorrectly received by the motion sensor or the thermostat. The control device 106 may coordinate wireless energy transfers, at least in part, in this manner, particularly with respect to designating the energy receiving device 108*a,b* that is to receive any given wireless energy transfer.

The control device 106 may determine instructions indicating that the thermal-energy harvester is to perform the wireless energy transfer to the light controller, at the third frequency, and at a specified time or time period (e.g., 3:00 PM to 3:10 PM). The control device 106 may provide the instructions to the light controller and the thermal-energy harvester. The light controller may configure (e.g., tune) the light controller's antenna to the third frequency at the specified time. At the specified time, the thermal-energy harvester may generate a beam (e.g., radio waves or laser) at the third frequency to perform the wireless energy transfer. The light controller may receive the wireless energy transfer via the antenna tuned to the third frequency. The thermostat and the motion sensor may be unable to tune to (or are not tuned to) the third frequency and do not receive the wireless energy transfer.

Figure 5:
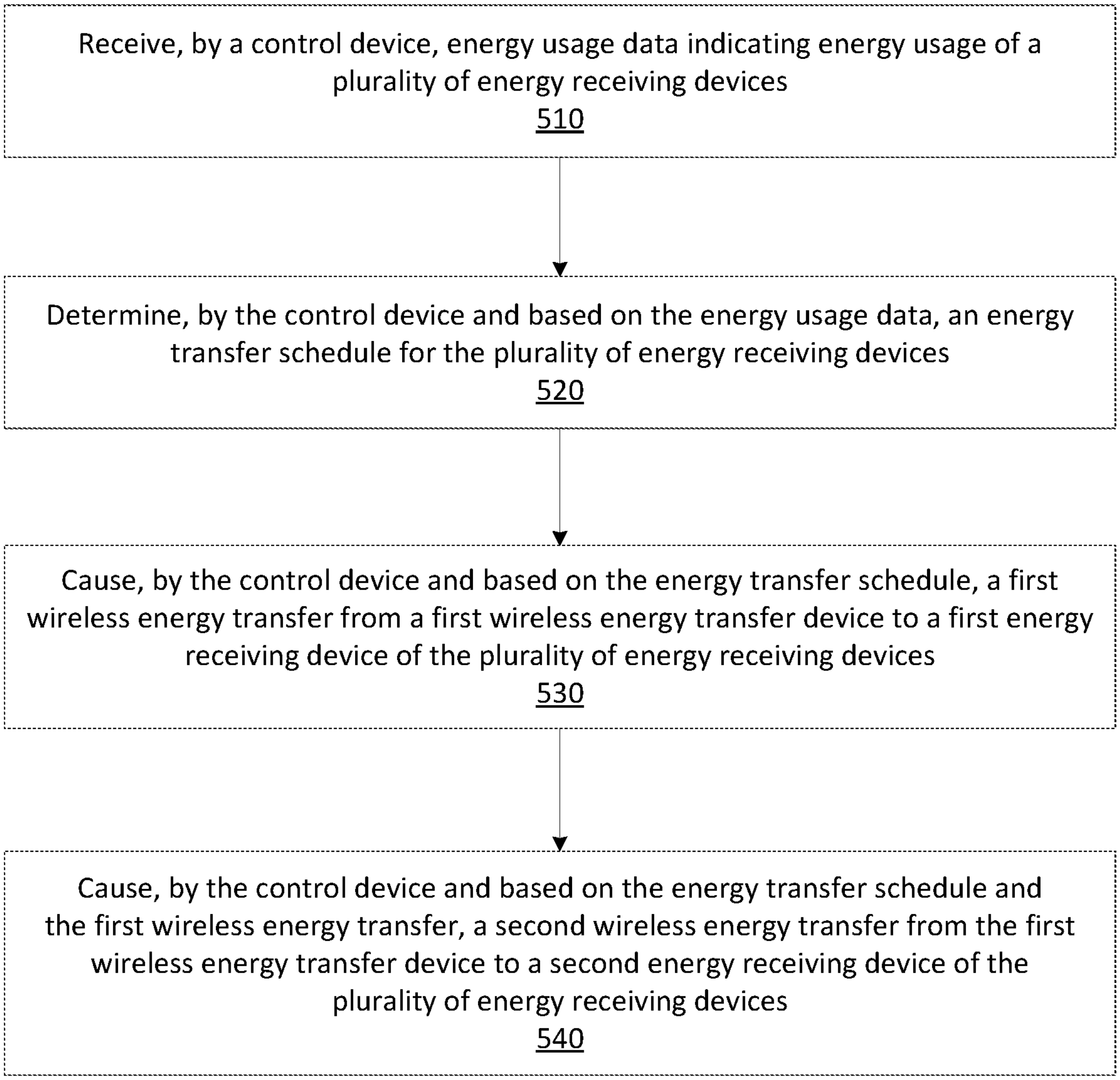
FIG. 5 is a flow diagram of a method.

Referring to FIG. 5, energy usage data indicating energy usage of a plurality of energy receiving devices may be received by a control device, at step 510. The control device 106 in FIG. 1 may receive energy usage data indicating energy usage of the one or more energy receiving devices 108*a,b* in FIG. 1. The energy usage data may indicate at least one of: a battery energy level (or an energy level of another type of energy storage device or component), an energy usage rate, an interval between energy usage, exceeding an energy level threshold, falling below an energy level threshold, a time of energy usage, and a start time of energy usage and a corresponding end time of energy usage. The energy usage data may comprise data relating to energy received, via wireless energy transfer, by the one or more energy receiving devices 108*a,b* in FIG. 1, such as a time of receiving energy, an aggregate quantity of energy received over a period of time, a start time of receiving energy and a corresponding end time of receiving energy, and falling below an energy reception minimum threshold.

At step 520, an energy transfer schedule may be determined by the control device for the plurality of energy receiving devices based on the energy usage data. The control device 106 in FIG. 1 may determine an energy transfer schedule for the one or more energy receiving devices 108*a,b* in FIG. 1 based on the energy usage data.

At step 530, a first wireless energy transfer may be caused by the control device from a first wireless energy transfer device to a first energy receiving device of the plurality of energy receiving devices based on the energy transfer schedule. The control device 106 in FIG. 1 may cause a first wireless energy transfer from a first wireless energy transfer device of the one or more wireless energy transfer devices 102*a,b* in FIG. 1 to a first energy receiving device of the one or more energy receiving devices 108*a,b* in FIG. 1 based on the energy transfer schedule.

At step 540, a second wireless energy transfer may be caused by the control device from the first wireless energy transfer device to a second energy receiving device of the plurality of energy receiving devices based on the energy transfer schedule and the first wireless energy transfer. The control device 106 in FIG. 1 may cause a second wireless energy transfer from the first wireless energy transfer device of the one or more wireless energy transfer devices 102*a,b* in FIG. 1 to a second energy receiving device of the one or more energy receiving devices 108*a,b* in FIG. 1 based on the energy transfer schedule and the first wireless energy transfer.

Power generation data indicating power generation of the first wireless energy transfer device may be received by the control device. The control device 106 in FIG. 1 may receive power generation data indicating power generation of the first wireless energy transfer device of the one or more wireless energy transfer devices 102*a,b* in FIG. 1. A power generation schedule may be determined by the control device based on the power generation data. The control device 106 in FIG. 1 may determine a power generation schedule based on the power generation data. The first wireless energy transfer and the second wireless energy transfer may be based on the power generation schedule.

The power generation data may indicate power generation of a second wireless energy transfer device. Power generation of at least one of the first wireless energy transfer device and the second wireless energy transfer device may be variable. The power generation data may indicate at least one of: an energy supply level, a power generation rate, an aggregate of energy quantity generated over a period of time, an interval between power generation, exceeding an energy transfer threshold, falling below an energy supply threshold, a time of power generation, and a start time of power generation and a corresponding end time of power generation. The power generation data may comprise data relating to energy transfers performed by the first wireless energy transfer device, such as a time of energy transfer, an aggregate of energy quantity transferred over a period of time, an interval between energy transfers, exceeding an energy transfer threshold, a start time of energy transfer and a corresponding end time of energy transfer.

The energy transfer schedule may indicate, for the first energy receiving device, at least one of: that the first wireless energy transfer device is to perform the wireless energy transfer, that the first energy receiving device is the recipient of the wireless energy transfer, a time for wireless energy transfer to the first energy receiving device; a quantity of energy for wireless energy transfer to the first energy receiving device; a start time and a corresponding end time for wireless energy transfer to the first energy receiving device;

one or more of the first wireless energy transfer device and the second wireless energy transfer device to wirelessly transfer energy to the first energy receiving device; a ratio, for a period of time, between 1) a quantity of energy for wireless energy transfer to the first energy receiving device, and 2) a quantity of energy for wireless energy transfer to the second energy receiving device; a ratio, for a period of time, between 1) an elapsed time of wireless energy transfer to the first energy receiving device, and 2) an elapsed time of wireless energy transfer to the second energy receiving device; a maximum time interval between wireless energy transfers to the first energy receiving device; a minimum time interval between wireless energy transfers to the first energy receiving device; and a minimum aggregate quantity of energy wirelessly transferred to the first energy receiving device over a period of time; a frequency (e.g., a radio frequency or light frequency) of a medium (e.g., radio waves or light waves) for the wireless energy transfer; a directionality for the wireless energy transfer; a location of the first energy receiving device (e.g., a location relative to the first wireless energy transfer device); an antenna of a plurality of antennas of the first wireless energy transfer device for use in performing the wireless energy transfer, such as an antenna that corresponds to the aforementioned frequency for the wireless energy transfer and/or an antenna with a directionality corresponding to the first energy receiving device. The frequency for the wireless energy transfer may correspond with a frequency to which the first energy receiving device is tuned. The frequency for the wireless energy transfer may correspond with a tuned frequency of an antenna of the first energy receiving device. The energy transfer schedule may be specific to the first wireless energy transfer device or may comprise energy transfer schedule data relating to other wireless energy transfer devices.

The power generation schedule may indicate, for the first wireless energy transfer device, at least one of: a time for power generation, a rate of power generation, a start time and a corresponding end time for power generation, one or more of the first energy receiving device and the second energy receiving device to wirelessly transfer energy, a maximum time interval between wireless energy transfers to the first energy receiving device, a minimum time interval between wireless energy transfers to the first energy receiving device, and a minimum aggregate quantity of power generation over a period of time. The power generation schedule may be specific to the first wireless energy transfer device or may comprise power generation schedule data relating to other wireless energy transfer devices.

A premises may comprise a refrigerator comprising an Internet of Things (IoT) device. The IoT device may allow the refrigerator to communicate with an IoT network. The IoT device may be battery-enabled. The premises may comprise a television and a remote control associated with the television. The remote control may be battery-enabled. The premises may comprise an energy harvester to capture energy from vibrations from a washing machine. The premises may comprise a solar cell to capture energy from light. The premises may comprise a local area network (LAN). The LAN may connect the IoT device, the remote control, the energy harvester, the solar cell, and/or a control device. The premises may comprise a personal area network (PAN), such as a low-rate wireless personal area network (LR-WPAN) based on or operating according to IEEE 802.15.4. The PAN may additionally or alternatively connect the IoT device, the remote control, the energy harvester, the solar cell, and/or a control device.

The energy harvester and/or the solar cell may capture energy and may provide information regarding the captured energy to the control device. The IoT device and/or the remote control may provide respective battery information and/or energy consumption information to the control device. The control device may determine that a level associated with a battery associated with the remote control is below or about to go below a 20% threshold. The control device may determine that the energy captured by the energy harvester is sufficient for the energy needs of the battery associated with the remote control. The control device may transmit a signal to the energy harvester to cause the energy harvester to transmit energy to the remote control. In response to the signal, the energy harvester may transmit energy to the remote control via a focused radio frequency (RF) beam.

FIG. 6 is a block diagram of an operating environment 600 in which the systems, methods, and apparatuses described herein may be implemented. The operating environment 600 may comprise one or more computing devices, such as a computing device 601 (e.g., computer). The one or more wireless energy transfer devices 102*a,b,* the control device 106, and/or the one or more energy receiving devices 108*a,b* in FIG. 1 may be and/or comprise a computing device as shown in FIG. 6. Similarly, one or more computing devices may be used to perform one or more functions in one or more locations. The operating environment 600 is not intended to suggest any limitation as to the scope of use or functionality of operating environment architecture 600. Neither should the operating environment 600 be interpreted as having any dependency or requirement relating to any one or combination of components shown in the operating environment 600.

The operating environment 600 may be configured according to one or more of a variety of general purpose or special purpose computing system environment configurations. Suitable computing systems, environments, and/or configurations may comprise, but are not limited to, personal computers, server computers, laptop devices, and multiprocessor systems. Suitable computing systems, environments, and/or configurations may additionally or alternatively comprise set top boxes, programmable consumer electronics, network PCs, minicomputers, mainframe computers, distributed computing environments that comprise any of the above systems or devices, and the like.

A computing device as shown in FIG. 6 may comprise one or more software components, which may be described in the general context of computer-executable instructions, such as program modules, being executed by one or more computers or other devices. Program modules comprise computer code, routines, programs, objects, components, data structures, etc. that perform particular tasks or implement particular abstract data types. The operating environment 600 may comprise grid-based or distributed computing environments where tasks are performed by remote processing devices that are linked through a communications network. In a distributed computing environment, program modules may be located in both local and remote computer storage media including memory storage devices.

The computing device 601 may comprise a general-purpose computing device. The components of the computing device 601 may comprise, but are not limited to, one or more processors 603, a system memory 612, and a system bus 613 that couples various system components including the processor 603 to the system memory 612. With multiple processors 603, the system may utilize parallel computing.

The system bus 613 represents one or more of several possible types of bus structures, including a memory bus or memory controller, a peripheral bus, an accelerated graphics port, and a processor or local bus using any of a variety of bus architectures. Such architectures may comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 613, and all buses specified in this description may be implemented over a wired or wireless network connection and each of the subsystems, including the processor 603, a mass storage device 604, an operating system 605, energy management software 606, energy management data 607, a network adapter 608, system memory 612, an Input/Output Interface 610, a display adapter 609, a display device 611, and a human machine interface 602, may be contained within one or more remote computing devices 614*a,b,c* at physically separate locations, connected through buses of this form, in effect implementing a fully distributed system.

The computing device 601 comprises a variety of computer readable media. Readable media may be any available media that is accessible by the computing device 601 and comprises both volatile and non-volatile media, removable and non-removable media. The system memory 612 may comprise computer readable media in the form of volatile memory, such as random access memory (RAM), and/or non-volatile memory, such as read only memory (ROM). The system memory 612 may comprise data such as energy management data 607 and/or program modules such as operating system 605 and energy management software 606 that are immediately accessible to and/or are presently operated on by the processor 603.

The computing device 601 may comprise other removable/non-removable, volatile/non-volatile computer storage media. FIG. 6 shows a mass storage device 604 which may provide non-volatile storage of computer code, computer readable instructions, data structures, program modules, and other data for the computing device 601. A mass storage device 604 may be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Any number of program modules may be stored on the mass storage device 604, including an operating system 605 and energy management software 606. Each of the operating system 605 and energy management software 606 (or some combination thereof) may comprise elements of the programming and the energy management software 606. Energy management data 607 may be stored on the mass storage device 604. Energy management data 607 may be stored in any of one or more databases known in the art. Such databases may comprise, DB2®, Microsoft® Access, Microsoft® SQL Server, Oracle®, mySQL, PostgreSQL, and the like. The databases may be centralized or distributed across multiple systems.

The user may enter commands and information into the computing device 601 via an input device (not shown). Input devices may comprise, but are not limited to, a keyboard, pointing device (e.g., a "mouse"), a microphone, a joystick, tactile input devices such as gloves, and other body coverings, and the like. These and other input devices may be connected to the processor 603 via a human machine interface 602 that is coupled to the system bus 613, but may be connected by other interface and bus structures, such as a parallel port, game port, an IEEE 1394 Port (also known as a Firewire port), a serial port, or a universal serial bus (USB).

A display device 611 may be connected to the system bus 613 via an interface, such as a display adapter 609. It is contemplated that the computing device 601 may have more than one display adapter 609 and the computing device 601 may have more than one display device 611. A display device may be a monitor, an LCD (Liquid Crystal Display), or a projector. Output peripheral devices may comprise components such as speakers (not shown) and a printer (not shown) which may be connected to the computing device 601 via Input/Output Interface 610. Any step and/or result of the methods may be output in any form to an output device. Such output may be any form of visual representation, including, but not limited to, textual, graphical, animation, audio, tactile, and the like. The display 611 and computing device 601 may be part of one device, or separate devices.

The computing device 601 may operate in a networked environment using logical connections to one or more remote computing devices 614*a,b,c*. A remote computing device may comprise a personal computer, portable computer, smartphone, a server, a router, a network computer, a peer device or other common network node, and so on. Logical connections between the computing device 601 and a remote computing device 614*a,b,c* may be made via a network 615, such as a local area network (LAN) and a general wide area network (WAN). Such network connections may be through a network adapter 608. A network adapter 608 may be implemented in both wired and wireless environments. Such networking environments may be located in dwellings or offices and comprise at least a portion of enterprise-wide computer networks, intranets, and the Internet.

Application programs and other executable program components such as the operating system 605 are shown herein as discrete blocks, although it is recognized that such programs and components may reside at various times in different storage components of the computing device 601, and are executed by the data processor(s) of the computer. An implementation of energy management software 606 may be stored on or transmitted across some form of computer readable media. Any of the disclosed methods may be performed by computer readable instructions embodied on computer readable media. Computer readable media may be any available media that may be accessed by a computer. Computer readable media may comprise "computer storage media" and "communications media." "Computer storage media" may comprise volatile and non-volatile, removable and non-removable media implemented in any methods or technology for storage of information such as computer readable instructions, data structures, program modules, or other data. Computer storage media may comprise, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by a computer.

What is claimed is:

1. A method comprising:

receiving, by a control device, energy usage data for a plurality of energy receiving devices and power generation data for a plurality of energy transfer devices;

determining, by the control device and based on the energy usage data and the power generation data, an energy transfer schedule for the plurality of energy receiving devices and the plurality of energy transfer devices, wherein the energy transfer schedule schedules a first wireless energy transfer from a first wireless energy transfer device of the plurality of energy transfer devices to a first energy receiving device of the plurality of energy receiving devices and a second wireless energy transfer from a second wireless energy transfer device of the plurality of energy transfer devices to over a second energy receiving device of the plurality of energy receiving devices;

causing, by the control device and based on the energy transfer schedule, the first wireless energy transfer from the first wireless energy transfer device of the plurality of energy transfer devices to the first energy receiving device of the plurality of energy receiving devices; and causing, by the control device and based on the energy transfer schedule, the second wireless energy transfer from the second wireless energy transfer device of the plurality of energy transfer devices to the second energy receiving device of the plurality of energy receiving devices.

2. The method of claim 1, wherein the energy usage data indicates one or more of a battery energy level, an energy usage rate, or a time associated with energy usage.

3. The method of claim 2, wherein the energy transfer schedule prioritizes the first energy receiving device of the plurality of energy receiving devices over the second energy receiving device of the plurality of energy receiving devices based on:

a time of operation of the first energy receiving device of the plurality of energy receiving devices being before a time of operation of the second energy receiving device of the plurality of energy receiving devices.

4. The method of claim 1, further comprising:

determining, by the control device and based on the power generation data, a power generation schedule, wherein the first wireless energy transfer and the second wireless energy transfer are further based on the power generation schedule.

5. The method of claim 4, further comprising:

causing, by the control device and based on the power generation schedule, an increase or decrease in an amount of power generation by one or more of the first wireless energy transfer device of the plurality of energy transfer devices or the second wireless energy transfer device of the plurality of energy transfer devices.

6. The method of claim 1, wherein the power generation data indicates one or more of an energy supply level, a power generation rate, or a time associated with power generation.

7. The method of claim 1, wherein the energy usage data indicates energy levels of the first and second energy receiving devices of the plurality of energy receiving devices falling below one or more pre-defined thresholds.

8. The method of claim 7, wherein the one or more pre-defined thresholds are automatically set based on an operational history of one or more of the first energy receiving device of the plurality of energy receiving devices or the second energy receiving device of the plurality of energy receiving devices.

9. The method of claim 1, wherein the power generation data indicates one or more of an aggregate of energy quantity generated over a period of time, an interval between power generation, data indicative of falling below an energy supply threshold, or a start time of power generation and a corresponding end time of power generation.

10. The method of claim 1, further comprising:

sending instructions to the first wireless energy transfer device of the plurality of energy transfer devices to transfer energy at a first frequency associated with the first energy receiving device of the plurality of energy receiving devices, and sending instructions to the second wireless energy transfer device of the plurality of energy transfer devices to transfer energy at a second frequency associated with the second energy receiving device of the plurality of energy receiving devices, wherein the second frequency associated with the second energy receiving device of the plurality of energy receiving devices is different than the first frequency associated with the first energy receiving device of the plurality of energy receiving devices.

11. The method of claim 1, further comprising:

sending instructions to the first wireless energy transfer device of the plurality of energy transfer devices to transfer energy at a first directionality associated with the first energy receiving device of the plurality of energy receiving devices, and sending instructions to the second wireless energy transfer device of the plurality of energy transfer devices to transfer energy at a second directionality associated with the second energy receiving device of the plurality of energy receiving devices, wherein the second directionality associated with the second energy receiving device of the plurality of energy receiving devices is different than the first directionality associated with the first energy receiving device of the plurality of energy receiving devices.

12. A system comprising:

a plurality of energy receiving devices; and a control device configured to communicate with the plurality of energy receiving devices, wherein the control device is configured to:

receive energy usage data for the plurality of energy receiving devices;

receive power generation data for a plurality of energy transfer devices;

determine, based on the energy usage data and the power generation data, an energy transfer schedule for the plurality of energy receiving devices and the plurality of energy transfer devices, wherein the energy transfer schedule schedules a first wireless energy transfer from a first wireless energy transfer device of the plurality of energy transfer devices to a first energy receiving device of the plurality of energy receiving devices and a second wireless energy transfer from a second wireless energy transfer device of the plurality of energy transfer devices to a second energy receiving device of the plurality of energy receiving devices based;

cause, based on the energy transfer schedule, the first wireless energy transfer from a first wireless energy transfer device of the plurality of energy transfer devices to the first energy receiving device of the plurality of energy receiving devices; and cause, based on the energy transfer schedule, the second wireless energy transfer from the first wireless energy transfer device of the plurality of energy transfer devices to the second energy receiving device of the plurality of energy receiving devices.

13. The system of claim 12, wherein the energy transfer schedule prioritizes the first energy receiving device of the plurality of energy receiving devices over the second energy receiving device of the plurality of energy receiving devices based on:

a time of operation of the first energy receiving device of the plurality of energy receiving devices being before a time of operation of the second energy receiving device of the plurality of energy receiving devices.

14. The system of claim 12, wherein the energy usage data indicates one or more of a battery energy level, an energy usage rate, or a time associated with energy usage.

15. The system of claim 12, wherein the control device is further configured to:

determine, based on the power generation data, a power generation schedule, wherein the first wireless energy transfer and the second wireless energy transfer are further based on the power generation schedule.

16. The system of claim 15, wherein the power generation data indicates one or more of an energy supply level, a power generation rate, or a time associated with power generation.

17. A device comprising:

one or more processors; and memory storing instructions that, when executed by the one or more processors, cause the device to:

receive energy usage data for a plurality of energy receiving devices;

receive power generation data for a plurality of energy transfer devices;

determine, based on the energy usage data and the power generation data, an energy transfer schedule for the plurality of energy receiving devices and the plurality of energy transfer devices, wherein the energy transfer schedule schedules a first wireless energy transfer from a first wireless energy transfer device of the plurality of energy transfer devices to a first energy receiving device of the plurality of energy receiving devices and a second wireless energy transfer from a second wireless energy transfer device of the plurality of energy transfer devices to a second energy receiving device of the plurality of energy receiving devices;

cause, based on the energy transfer schedule, the first wireless energy transfer from a first wireless energy transfer device of the plurality of energy transfer devices to the first energy receiving device of the plurality of energy receiving devices; and cause, based on the energy transfer schedule, the second wireless energy transfer from the first wireless energy transfer device of the plurality of energy transfer devices to the second energy receiving device of the plurality of energy receiving devices.

18. The device of claim 17, wherein the instructions, when executed by the one or more processors, further cause the device to:

determine, based on the power generation data, a power generation schedule, wherein the first wireless energy transfer and the second wireless energy transfer are further based on the power generation schedule.

19. The device of claim 18, wherein the instructions, when executed by the one or more processors, further cause the device to:

cause, based on the power generation schedule, an increase or decrease in an amount of power generation by one or more of the first wireless energy transfer device of the plurality of energy transfer devices or a second wireless energy transfer device of the plurality of energy transfer devices.

20. The device of claim 17, wherein the energy transfer schedule prioritizes the first energy receiving device of the plurality of energy receiving devices over the second energy receiving device of the plurality of energy receiving devices based on:

a time of operation of the first energy receiving device of the plurality of energy receiving devices being before a time of operation of the second energy receiving device of the plurality of energy receiving devices.

* * * * *